(12) United States Patent
Takase et al.

(10) Patent No.: US 6,929,977 B2
(45) Date of Patent: Aug. 16, 2005

(54) METHOD OF INTRODUCING RESIN FOR ELECTRONIC COMPONENT AND APPARATUS USED THEREFOR

(75) Inventors: Shinji Takase, Kyoto (JP); Takashi Tamura, Kyoto (JP); Yohei Onishi, Kyoto (JP)

(73) Assignee: Towa Corporation, Kyoto (JP)

( * ) Notice: Subject to any disclaimer, the term of this patent is extended or adjusted under 35 U.S.C. 154(b) by 0 days.

(21) Appl. No.: 10/648,153

(22) Filed: Aug. 25, 2003

(65) Prior Publication Data

US 2004/0063234 A1 Apr. 1, 2004

(30) Foreign Application Priority Data

Sep. 27, 2002 (JP) ........................................ 2002-283014

(51) Int. Cl.[7] .............................................. H01L 21/44
(52) U.S. Cl. ...................... 438/106; 438/107; 438/108; 438/127
(58) Field of Search ................................ 438/106–108, 438/127; 264/511, 102, 272.17

(56) References Cited

U.S. PATENT DOCUMENTS 6,770,236 B2 * 8/2004 Miyajima .................... 264/511
2002/0017738 A1 * 2/2002 Miyajima .............. 264/272.17

* cited by examiner

*Primary Examiner*—Hsien-Ming Lee
(74) *Attorney, Agent, or Firm*—W. F. Fasse; W. G. Fasse

(57) ABSTRACT

A substrate with a plurality of semiconductor chips mounted thereon is set in a die. The die is then clamped. The die thus clamped forms a space, into which resin is introduced. In doing so, a member is provided to fill a gap between an upper surface of each chip and the die. The member is elastic and thus elastically deforms when the die is clamped. Thus from the elastic member to each chip's upper surface a substantially uniform pressure is exerted. The elastic member is a film extending substantially parallel to each chip's upper surface and contacts the upper surface as the member is tensioned in its in-plane direction. The above resin introduction step can prevent the semiconductor chip from having an upper surface with resin flash.

7 Claims, 7 Drawing Sheets

METHOD OF INTRODUCING RESIN FOR ELECTRONIC COMPONENT AND APPARATUS USED THEREFOR

BACKGROUND OF THE INVENTION

1. Field of the Invention

The present invention relates to methods of introducing resin into a gap between a substrate and a semiconductor chip to produce an electronic component (a flip chip) and apparatuses used therefor.

2. Description of the Background Art

Conventionally a method using a die (receiving resin) formed of a fixed top part and a movable bottom part to introduce resin to produce an electronic component is known. In this method, resin is introduced between a substrate and each of a plurality of semiconductor chips mounted on the substrate via a bump integrally (Hereinafter a substrate with a plurality of semiconductor chips mounted thereon will be referred to as a "substrate with chips mounted thereon").

The aforementioned electronic component production method proceeds as follows: initially, a substrate with chips mounted thereon is fitted into a setting recess provided in the bottom part. Then the top and bottom parts are clamped together, when the plurality of semiconductor chips are fitted into a resin receiving cavity provided in the top part.

Then, a resin material heated and thus melted in a pot provided to the bottom part for supplying the resin material is pressurized by a plunger and thus introduced into the cavity. In the cavity, the semiconductor chips have their top and lateral sides and gaps between the chips and the substrate filled with the resin.

After a period of time required for the melted resin to set has elapsed, the top and bottom parts are unclamped. A substrate with resin molded (set) on the semiconductor chips' top and lateral sides and gaps between the chips and the substrate is thus obtained.

The substrate with the resin mold is then cut as required to provide a piece having a resin mold corresponding to each of the semiconductor chips.

In the above described conventional resin introduction method when in the cavity a substrate with a resin mold is to be produced the plurality of semiconductor chips may have different heights. Furthermore, the chips may have an upper surface inclining relative to the substrate's main surface. This may result in a gap formed between the cavity's ceiling and any of the upper surfaces of the chips. In the resin introduction step the gap may receive melted resin. As a result, the semiconductor chip may have the upper surface with resin flash formed thereon disadvantageously.

SUMMARY OF THE INVENTION

The present invention has been made to overcome the above described disadvantage and it contemplates a method of introducing resin for an electronic component that prevents formation of resin flash, and an apparatus used therefor.

The present resin introduction method employs an apparatus including a die for introducing resin for an electronic component to introduce melted resin material between each of a plurality of semiconductor chips mounted on a substrate and a surface of the substrate.

In the above method, each of the plurality of semiconductor chips has an upper surface in contact with a mold release film, and with the upper surface's height and inclination considered, via the mold release film the semiconductor chips have their respective upper surfaces individually subjected to equal pressure, while the melted resin material is introduced between each of the plurality of semiconductor chips and the surface of the substrate.

The above method can prevent formation of resin flash due to introduced resin reaching any of upper surfaces respectively of the plurality of semiconductor chips. Furthermore, desirably, an elastic member is inserted between each semiconductor chip and the die to allow the plurality of semiconductor chips to have their respective upper surfaces receiving substantially uniform pressure so that when the die is clamped the elastic member elastically deforms and the plurality of semiconductor chips can have their respective upper surfaces receiving substantially uniform pressure.

Furthermore, desirably, the elastic member is a film extending substantially parallel to each chip's upper surface and contacts the upper surface as the member is tensioned in its in-plane direction. This allows the elastic member to be free of wrinkles, which can further ensure that each chip's upper surface and the elastic member does not have a gap therebetween.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter a method of introducing resin for an electronic component and an apparatus used therefore in an embodiment of the present invention will be described with reference to FIGS. 1–10.

Figure 1:
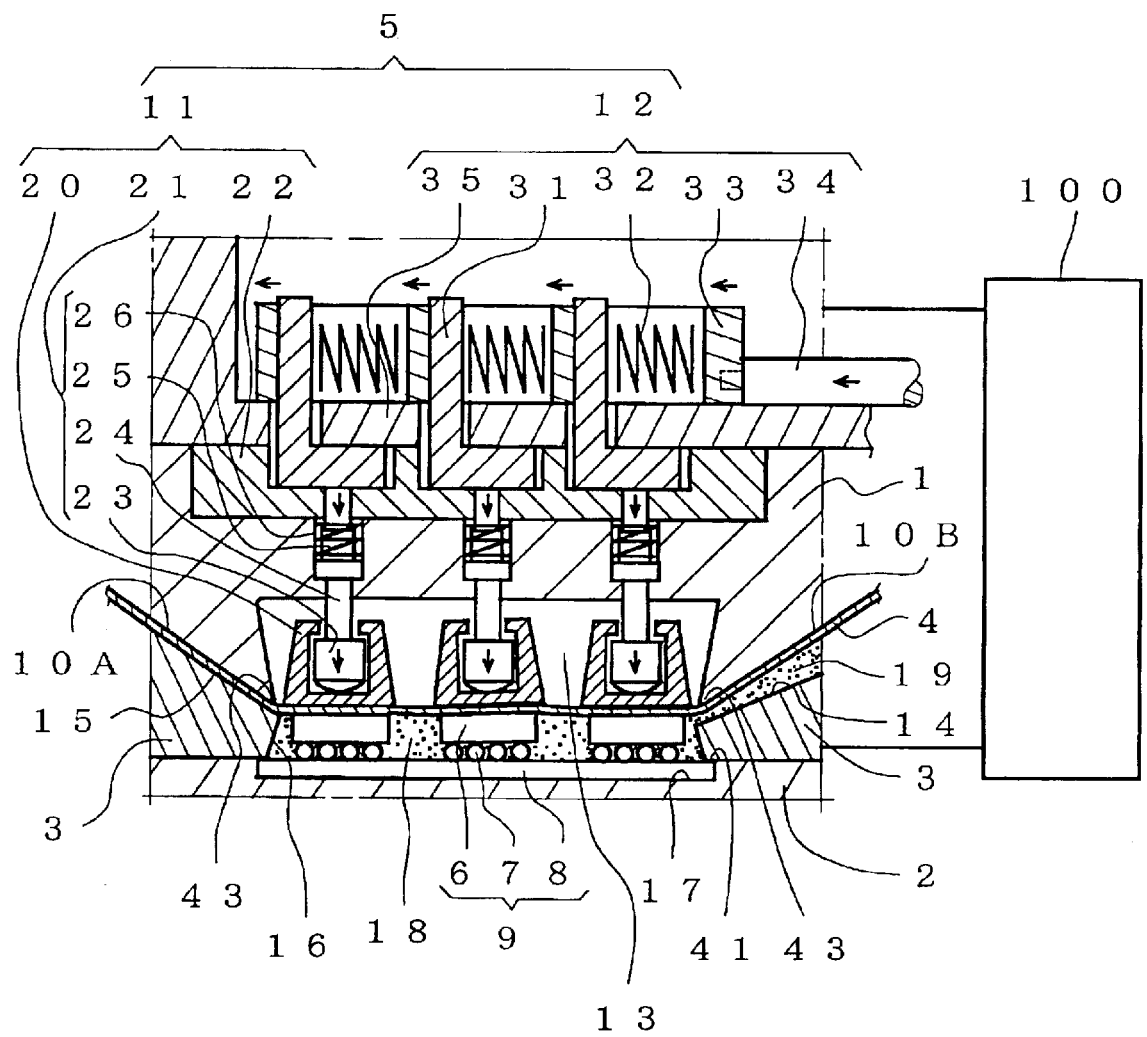
FIG. 1 is a schematic, longitudinal cross section of a resin introduction apparatus in an embodiment.

In the present embodiment the apparatus includes a die having a top part 1 and a bottom part 2 arranged opposite top part 1, as shown in FIG. 1. Between top and bottom parts 1 and 2 an intermediate plate 3 is arranged. As such, resin is introduced into a die formed of the three parts of top and bottom parts 1 and 2 and intermediate plate 3.

Top part 1 has a parting surface covered with a mold release film 4 fed by a film feed mechanism (not shown) between top part 1 and intermediate plate 3 and tensioned thereby as predetermined. Top part 1 is provided with a pressure mechanism 5 exerting force against semiconductor chips 6 on their respective upper surfaces equally with mold release film 4 posed therebetween.

Pressure mechanism 5 includes a chip pressing portion 11 and equal-pressurization portion 12. Chip pressing portion 11 exerts force against the plurality of semiconductor chips 6 on their respective upper surfaces with mold release film 4 posed therebetween. Note that chip pressing portion 11 moves to a position corresponding to the levels and inclinations of the upper surfaces of the plurality of semiconductor chips 6, and equal-pressurization portion 12 exerts pressure against a plurality of chip pressing portions 11 equally to prevent the plurality of semiconductor chips 6 and mold release film 4 from having a gap therebetween.

Figure 6:
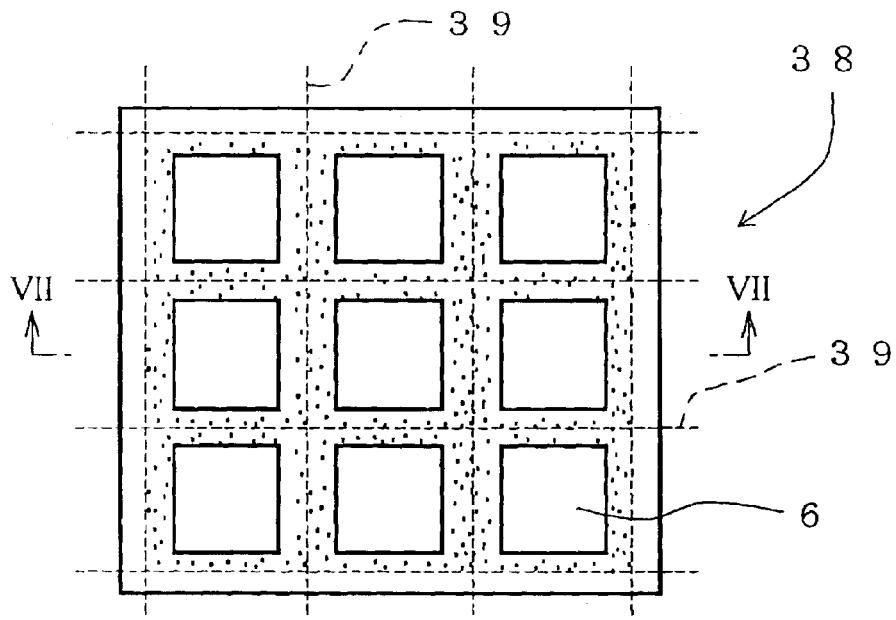
FIG. 6 is a schematic plan view of an example of a substrate with a resin mold in an embodiment.
Figure 7:
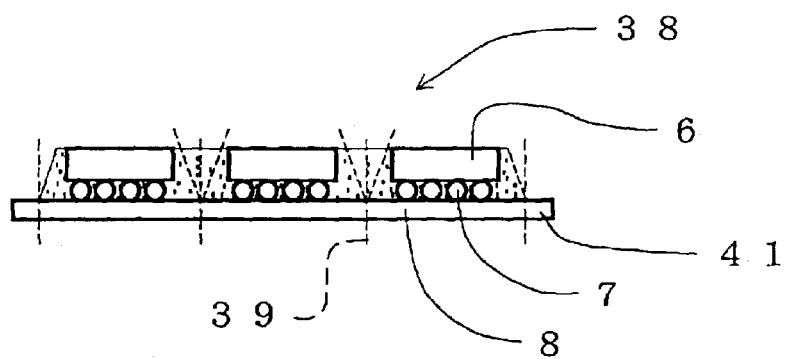
FIG. 7 is a cross section taken along the line VII—VII of FIG. 6.

Furthermore, as used in the present embodiment, a substrate 8 has a plurality of (nine, for example) semiconductor chips 6 mounted thereon, as shown in FIGS. 6 and 7. Furthermore, between substrate 8 and a bottom surface of each semiconductor chip 6 a plurality of bumps 7 (a connection electrode) are provided so as to electrically connect substrate 8 with each of the plurality of semiconductor chips 6 together.

As such, the plurality of semiconductor chips 6 are mounted on substrate 8 by the plurality of bumps 7. Substrate 8 with the plurality of semiconductor chips 6 mounted thereon is referred to as a flip chip substrate 9 (hereinafter simply referred to as "FC substrate 9"). FC substrate 9 is one example of a substrate with an electronic component mounted thereon (a substrate with a chip mounted thereon) in accordance with the present invention.

As shown in FIG. 1, the resin introduction apparatus with the 3-part die is used to introduce resin between semiconductor chip 6 and substrate 8, i.e., provide underfill for FC substrate 9. Note that while in the present embodiment FC substrate 9 is substrate 8 with nine semiconductor chips 6 mounted thereon, FC substrate 9 may have mounted thereon any number of semiconductor chips 6 other than nine, as changed as appropriate.

Furthermore, top part 1, as shown in FIG. 1, has a parting surface provided with an inclination 10A, 10B brought into contact with mold release film 4 when the die is clamped. This tensions mold release film 4 in an in-plane direction. In this condition, mold release film 4 covers an upper surface of semiconductor chip 6 and is also pressed against intermediate plate 3. Mold release film 4 at that time forms a protrusion.

Furthermore, between inclinations 10A and 10B the top part forms a space 13. In space 13, pressure mechanism 5 has a lower end protruding to be lower than a bottom portion 43 of inclination 10A, 10B.

Furthermore, intermediate plate 3, as shown in FIG. 1, is provided with an inclination 14 introducing resin for transfer-molding. Furthermore, intermediate plate 3 has an inclination 15 corresponding to inclination 10A of top part 1. When the die is clamped, inclinations 10A and 15 sandwich mold release film 4. Furthermore, intermediate plate 3 has a resin holding surface 16 holding a lateral side of resin introduced for FC substrate 9.

Furthermore, bottom part 2, as shown in FIG. 1, is provided with a recess 17 receiving FC substrate 9. FC substrate 9 is set in recess 17 with the semiconductor chip 6 upper surface facing upward.

When the aforementioned, 3-part die is used to introduce resin for FC substrate 9 between semiconductor chip 6 and substrate 8, initially at bottom part 2 in recess 17 FC substrate 9 is set, and then bottom part 2 and intermediate plate 3 are clamped together and mold release film 4 is also tensioned along the geometry of each inclination 10A, 10B of top part 1. In this condition, top and bottom parts 1 and 2 intermediate plate 3 are completely clamped together, as shown in FIG. 1, by a clamping mechanism 100.

When the die is clamped, the intermediate plate 3 resin holding surface 16, mold release film 4, and the substrate 8 upper surface together form a cavity space 18. Furthermore, inclination 10B of top part 1 covered with mold release film 4 and inclination 14 of intermediate plate 3 for introducing resin together form a gate space 19 serving as a path introducing the resin. Gate space 19 communicates with cavity space 18.

Note that desirably, the 3-part die has a heater (not shown) embedded therein, as appropriate. In that case, heated and melted resin 37 is introduced into cavity space 18 and gate space 19.

In accordance with the present method of introducing resin for an electronic component, pressure mechanism 5 incorporated in top part 1 utilizes the elasticity of mold release film 4 to eliminate a gap formed above an upper surface of each semiconductor chip 6 and also exert force against the plurality of semiconductor chips 6 on their respective upper surfaces equally. This prevents the plurality of semiconductor chips 6 from having their respective upper surfaces with resin flash formed thereon.

Hereinafter, pressure mechanism 5 will more specifically be described.

As has been described previously, pressure mechanism 5 includes pressing portion 11 and equal-pressurization portion 12 incorporated in the top part's space 13 formed between inclinations 10A and 10B of top part 1. Furthermore, pressure mechanism 5 is configured to be detachably attachable to accommodate to the number, geometry and the like of semiconductor chips 6.

Furthermore, pressing portion 11, as shown in FIG. 1, is provided with an adjustment member 20 adjusting an inclination of a direction in which the semiconductor chip 6 upper surface is pressed. Adjustment member 20 varies in direction to accommodate to an inclination of an upper surface of each semiconductor chip 6. Furthermore, pressing portion 11 is provided with a pressing member 21 pressing adjustment member 20. Furthermore, pressing member 21 is attached to top part 1. Furthermore, pressing portion 11 has a fixed block 22 provided with a sliding portion for pressing member 21 to vertically reciprocate as it slides.

Note that pressing member 21 has an end member 23 semi-spherical closer to intermediate plate 3 and contacting adjustment member 20 to allow adjustment member 20 to be movable, as desired. Furthermore, pressing member 21 has a rod 24 to which end member 23 is fixed and the rod 24 is pressed against adjustment member 20. Furthermore, pressing member 21 has a resilient member (such as a spring) 25 adjusting a positional relationship between rod 24 and fixed block 22. Resilient member 25 is provided internal to space 26, wound around rod 24.

Furthermore, more than one pressing portion 11 are provided to correspond to the plurality of semiconductor chips 6, respectively. Equal-pressurization portion 12, as shown in FIG. 1, includes a plurality of sliding members 31 which is in the form of a letter L sliding on fixed block 22. Furthermore between the plurality of sliding members 31 a plurality of resilient members 32, such as springs, are arranged. Furthermore, equal-pressurization portion 12 includes an equal-pressurization member 33 utilizing the resilience of the plurality of resilient members 32 to slide to exert force against the plurality of sliding members 31 equally. Furthermore, equal-pressurization portion 12 includes a drive member 34 driven for example by elastic material, air pressure, oil pressure or water pressure to exert force via equal-pressurization member 33 against the plurality of sliding members 31 equally. Furthermore, equal-pressurization portion 12 includes a block 35 which horizontally slides with resilient member 32, equal-pressurization member 33 and drive member 34 mounted thereon and also operates to allow sliding member 31 to be pressed against fixed block 22.

Figure 9:
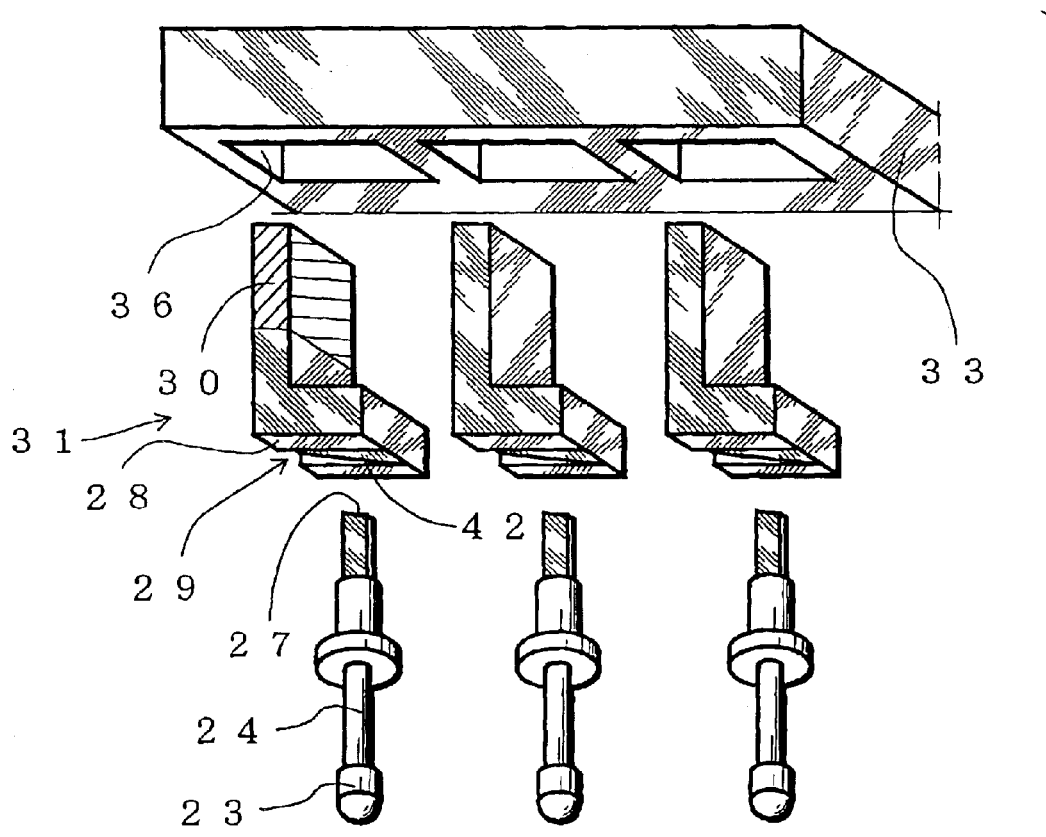
FIG. 9 is an enlarged, perspective view of a main portion of a pressure mechanism in an embodiment.
Figure 10:
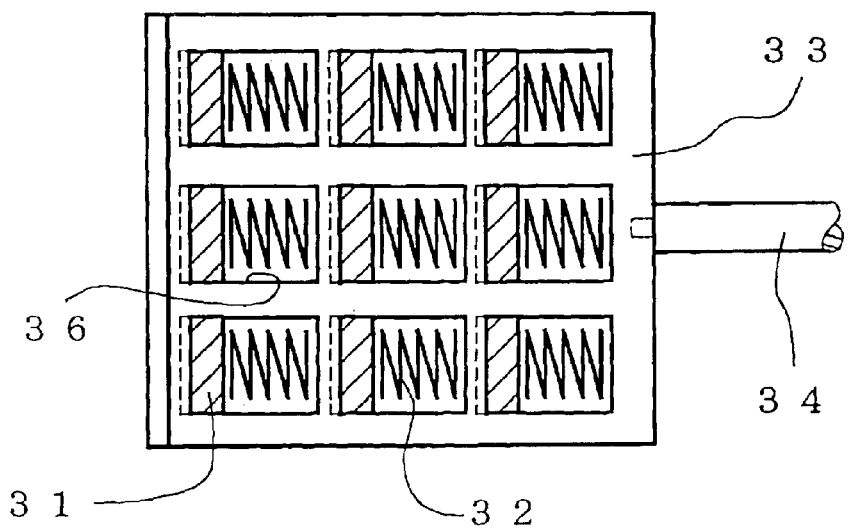
FIG. 10 is a schematic plan view of a main portion of the FIG. 9 mechanism.

With reference to FIGS. 1, 9 and 10, a mutual relationship of pressure mechanism 5 will now be described specifically.

Rod 24 has an upper surface provided with an engaging surface 27 having an inclination of a predetermined angle. Furthermore, sliding member 31 has a bottom portion 28 having a center provided with a recess 29. Recess 29 is provided with an inclined surface 42 engaging with engaging surface 27. Furthermore, engaging surface 27 of rod 24 and inclined surface 32 of sliding member 31 when engaged slide relative to each other.

Furthermore, equal-pressurization member 33 is provided with a plurality of pressing members 21, a plurality of sliding members 31 and a plurality of through holes 36 to correspond to a plurality of semiconductor chips 6, respectively. Furthermore, equal-pressurization member 33 is mounted on block 35. Through hole 36 receives a portion 30 (shown hatched in FIG. 9) of sliding member 31.

In the resin introduction step a gap formed between the plurality of semiconductor chips 6 and mold release film 4 is eliminated and pressure is applied against the plurality of semiconductor chips 6 on their respective upper surfaces equally. In doing so, equal-pressurization member 33 is horizontally slided by drive member 34. Thus the plurality of resilient members 32 fit into through holes 36 of equal-pressurization member 33 equally receive pressure.

Furthermore, sliding member 31 having portion 30 in contact with resilient member 32 also horizontally slides. Inclined surface 42 also horizontally slides. This allows inclined surface 42 of sliding member 31 to engage with engaging surface 27 of rod 24 to move rod 24, end member 23 and adjustment member 20 downward.

Furthermore, with inclined surface 42 and engaging surface 27 in engagement, between sliding member 31 and semiconductor chip 6 pressing portion 11 is restrained. More specifically, as sliding member 31 pushes rod 24, rod 24 in turn exerts force against semiconductor chips 6 on their respective upper surfaces. This eliminates a gap between the upper surfaces of semiconductor chips 6 and mold release film 4, no longer allowing the die to receive melted resin on the upper surfaces of semiconductor chips 6. Thus via mold release film 4 semiconductor chips 6 can have their respective upper surfaces receiving equal pressure.

When a resin introduction apparatus including the three parts, mold release film 4 and pressure equalizing mechanism 5 is employed, resin is introduced for FC substrate 9 between semiconductor chip 6 and substrate 8 in a method, as will now be described hereinafter specifically.

Figure 2:
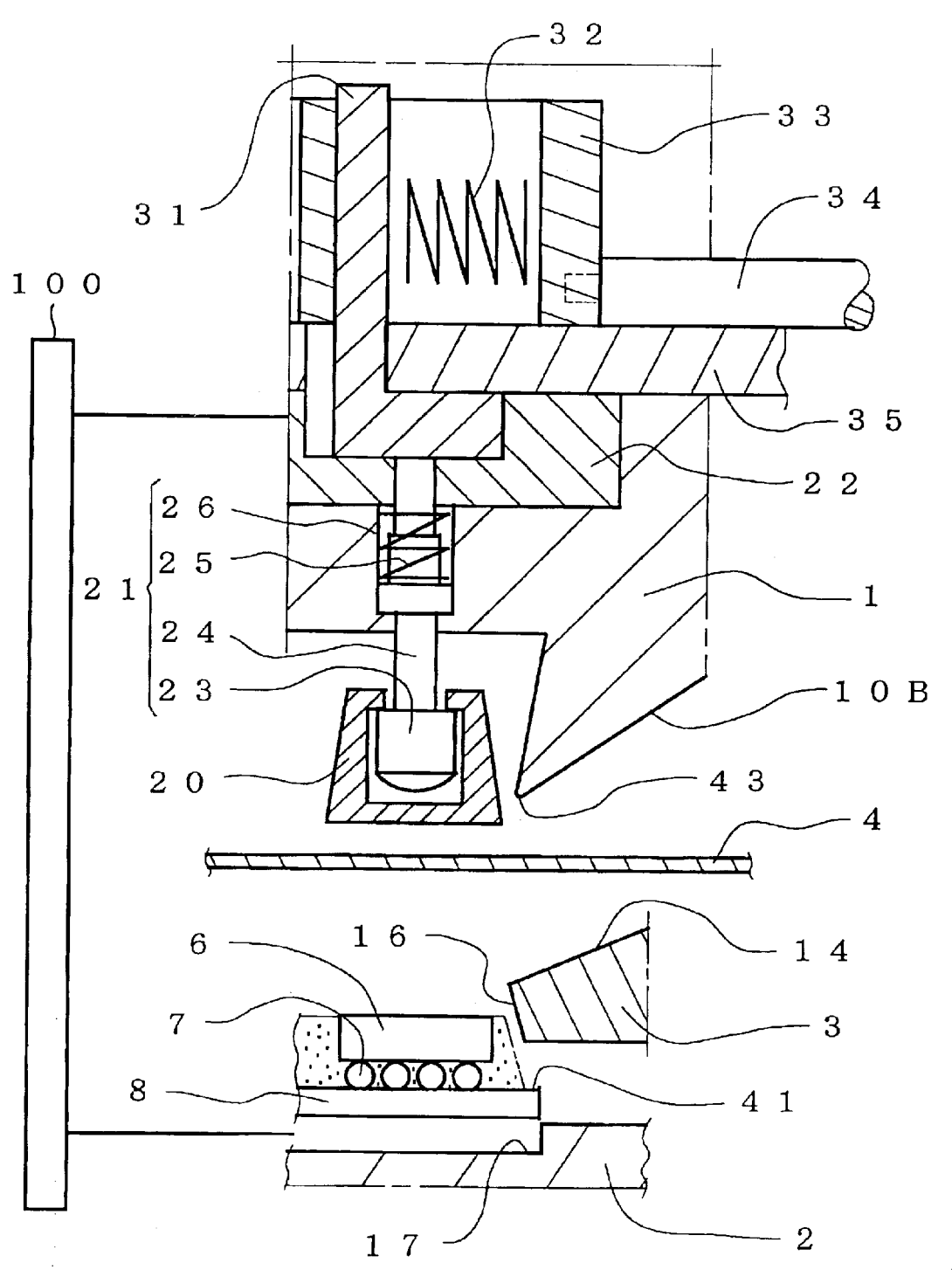
FIG. 2 is an enlarged view of a main portion of the FIG. 1 apparatus, as shown when the die is opened.

Initially, as shown in FIG. 2, clamping mechanism 100 unclamps the three parts of the die. In that position, mold release film 4 is out of contact with a lower surface of adjustment portion 20 of pressure mechanism 11 and also subjected to a predetermined tension between top part 1 and intermediate plate 3. FC substrate 9 is inserted from outside (not shown) the die and placed between intermediate plate 3 and bottom part 2.

In this condition, there is a gap between engaging surface 27 of rod 24 and inclined surface 42 of sliding member 31 and the semiconductor chip 6 upper surface does not receive pressure. In other words, in the die, a lower surface of adjustment portion 20 protrudes to be lower than bottom end 43 of top part 1. More specifically, resilient member 25 wound around rod 24 and accommodated in space 26 expands. In that condition, a plurality of fixed block 22 are used to restrain the plurality of pressing portion 11, respectively.

When semiconductor chip 6 does not receive pressure, resilient member 25 expands. However, it is necessary to consider that resilient member 25 might not expand. Accordingly, an air supply mechanism may be provided to supply each space 26 with air or the like. This air supply mechanism's function prevents resilient member 25 from failing to expand.

Figure 3:
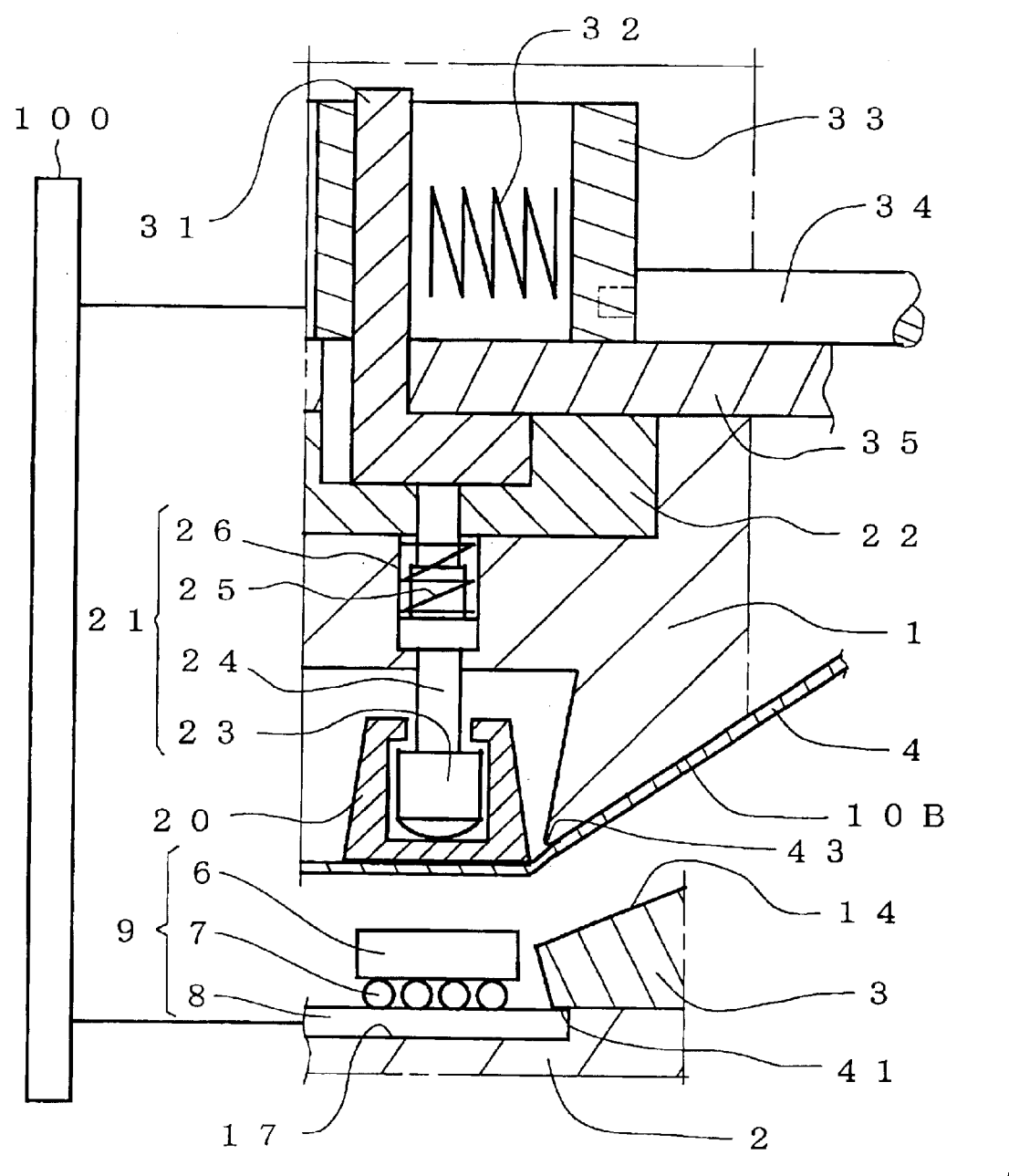
FIG. 3 is an enlarged view of the main portion of the FIG. 1 apparatus, with the top part covered with a mold release film.

Then, as shown in FIG. 3, FC substrate 9 is set in bottom part 2 at recess 17. Thereafter, intermediate plate 3 and bottom part 2 are clamped together. This allows a lower surface of intermediate plate 3 to engage with a peripheral portion 41 of FC substrate 9 at which resin is not molded. This prevents FC substrate 9 from disengaging from recess 17 and also the resin from entering and surrounding the substrate 8 peripheral portion 41 and side and lower surfaces. Note that mold release film 4 protrudes along inclination 10A, 10B of the parting surface of top part 1 and a lower surface of adjustment portion 20.

Figure 4:
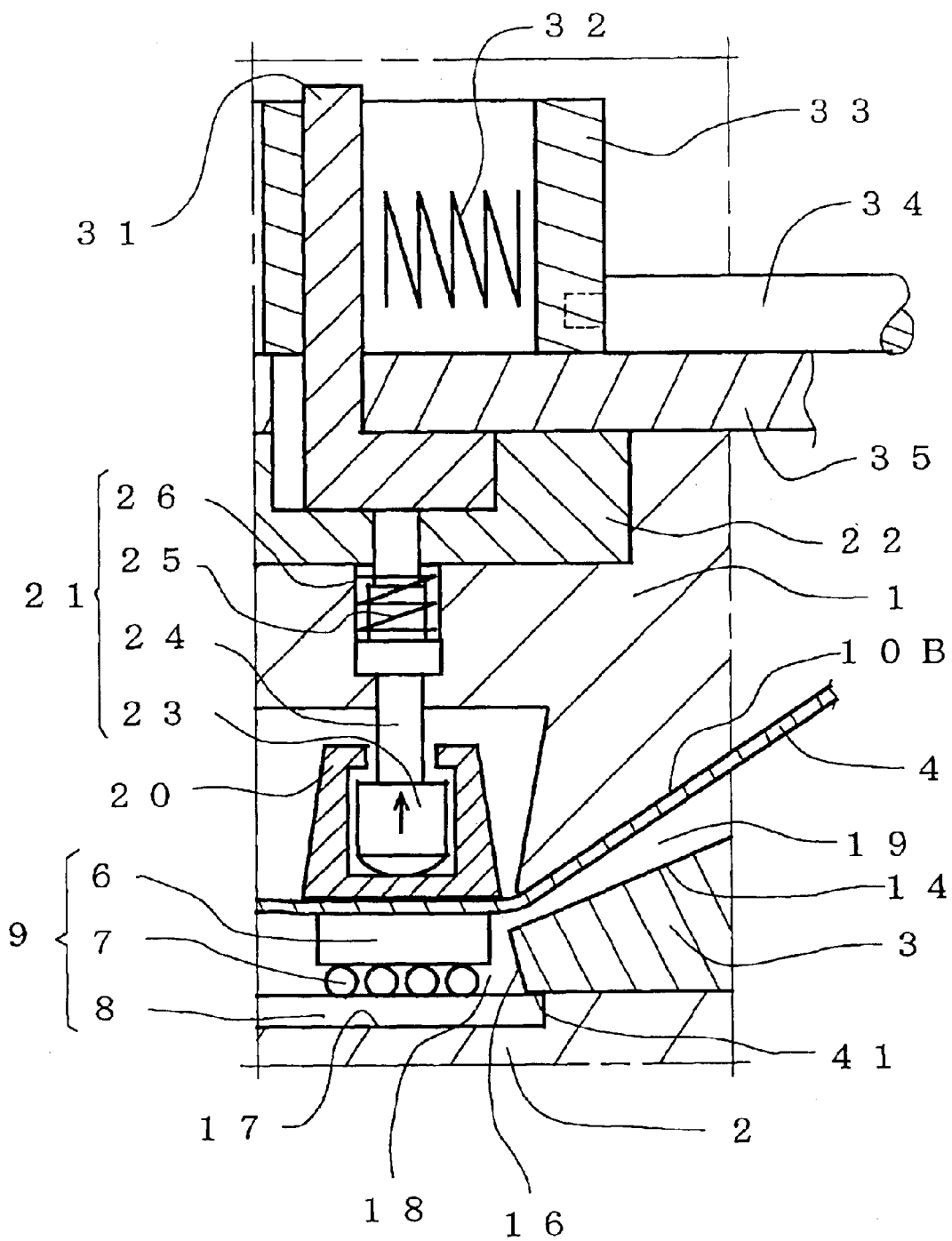
FIG. 4 is an enlarged view of the main portion of the FIG. 1 apparatus with the die clamped.

Then, as shown in FIG. 4, the three parts are completely clamped together with mold release film 4 sandwiched therebetween. In doing so, the pressure mechanism 5 adjustment portion 20 exerts force against semiconductor chips 6 on their respective upper surfaces with the chips' heights and inclinations considered. More specifically, adjustment portion 20, end member 23 and rod 24 move vertically upward (in a direction indicated in FIG. 4 by an arrow). Accordingly, resilient member 25 compresses. Engaging surface 27 of rod 24 and inclined surface 42 of sliding member 31 have their gap therebetween reduced. However, they are still not engaged.

Figure 5:
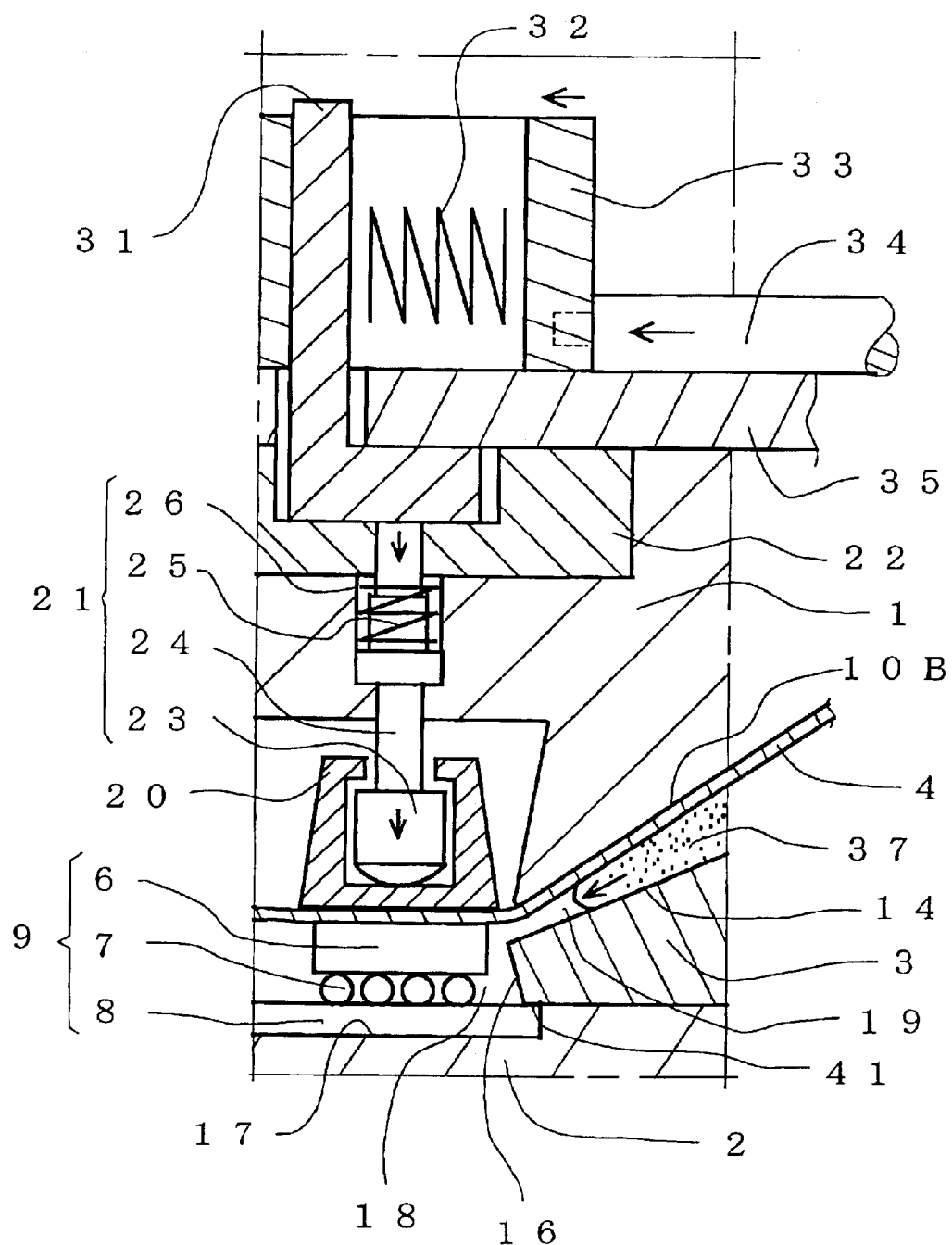
FIG. 5 is an enlarged view of the main portion of the FIG. 1 apparatus with underfill resin.

Then, as shown in FIG. 5, the three parts are completely clamped together. In this condition, drive member 34 is driven to slide equal-pressurization member 33 on block 35 horizontally (in a direction indicated in FIG. 5 by a leftward arrow). This allows the resilience of resilient member 32 to be utilized to allow sliding member 31 to slide horizontally. Consequently, inclined surface 42 of sliding member 31 engages with engaging surface 27 of rod 24. Then, from gate space 19 corresponding to a resin introduction path communicating with cavity space 18, heated and melted resin 37 is introduced.

In the above described resin introduction method, resin underfill can be provided such that there is no gap between upper surfaces of the plurality of semiconductor chips 6 and mold release film 4 and also via mold release film 4 the plurality of semiconductor chips 6 have their respective upper surface receiving equal pressure.

Thereafter, melted resin 37 introduced into cavity space 18 sets. Then, as shown in FIG. 2, the three parts are unclamped. Thus, as shown in FIGS. 6 and 7, a substrate with a resin mold 38 surrounding an outer periphery of semiconductor chip 6 and also introduced between semiconductor chip 6 and substrate 8, is obtained.

Figure 8:
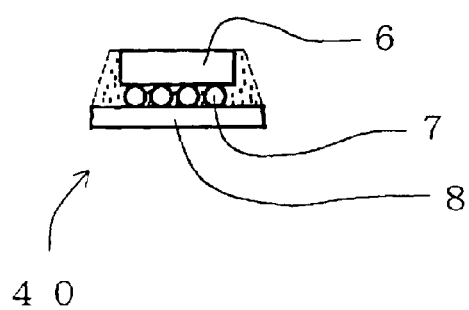
FIG. 8 is a cross section of a portion (a flip chip mold) of FIG. 7.

The substrate with a resin mold 38 is then cut at a portion 39, as required, indicated in FIGS. 6 and 7 by a broken line. Thus, as shown in FIG. 8, a piece with a resin mold 40 (a molded, flip chip product) corresponding to each semiconductor chip 6 is obtained. The plurality of semiconductor chips 6 can have an upper surface free of resin flash.

Furthermore while in the present method FC substrate 9 is set in bottom part 2 such that the surface of FC substrate 9 on which semiconductor chip 6 is mounted faces upward, FC substrate 9 may be set in top part 1 such that the surface of FC substrate 9 on which semiconductor chip 6 is mounted faces downward. Furthermore, there may be provided a means fixing FC substrate 9 to the three parts to prevent FC substrate 9 from disengaging from the three parts.

In an alternative resin introduction method, pressure mechanism 5 may exert force against an upper surface of a semiconductor chip mounted on a substrate and electrically connected to the substrate via a wire, while underfill may be provided. In other words, pressure mechanism 5 as aforementioned can be used for any substrates with semiconductor chips mounted thereon that can be subjected to underfill without sealing the chips' upper surfaces with resin.

Alternatively, the aforementioned resin introduction method's underfill may be provided in introducing resin while evacuating air internal to the three parts having their interior isolated from outside. Furthermore, the aforementioned resin introduction method may be performed such that semiconductor chip 6 has an upper surface with an adhesive mold release film stacked thereon.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for simultaneously molding a plurality of semiconductor chips, comprising the following steps:

a) securing said plurality of semiconductor chips with a first chip surface to a substrate so that spaces are provided between neighboring semiconductor chips on said substrate;

b) inserting said substrate with said semiconductor chip. thereon into a mold portion (2);

c) covering a second chip surface facing opposite said first chip surface of said plurality of semiconductor chips with a mold release film;

d) simultaneously and individually applying equal pressure to all of said second chip surfaces of said plurality of semiconductor chips so that each said second chip surface is fully covered by said mold release film, and so that gaps between said second chip surfaces and said mold release film are avoided;

e) closing said mold portion, except for a resin feed-in gate (19), to form a mold cavity between said mold release film and said substrate, whereby said plurality of semiconductor chips is enclosed in said mold cavity;

f) filling said mold cavity between said substrate and said mold release film with resin;

g) letting said resin set to form a molding (38) with said plurality of semiconductor chips held in place on said substrate by said resin; and h) opening said mold and removing said molding (38) from said mold portion.

2. The method of claim 1, further comprising the step of cutting said molding for separating said plurality of semiconductor chips to form individual molded semiconductor chips.

3. The method of claim 1, further comprising holding down said substrate by clamping an intermediate mold member against a peripheral portion (41) of said substrate.

4. The method of claim 1, further comprising performing said step of simultaneously and individually applying equal pressure to said second chip surfaces of said semiconductor chips in a resilient manner for accommodating different chip heights and different second chip surface formations.

5. The method of claim 1, further comprising tensioning said mold release film in a direction in a plan defined by said mold release film.

6. The method of claim 1, further comprising using a three part mold (1, 2, 3) for clamping said mold release film (4) between a first mold part (1) and a second mold part (3), resting against a third part formed by said mold portion (2).

7. An apparatus for simultaneously molding a plurality of semiconductor chips, said apparatus comprising means for performing steps a) to h) as defined in claim 1.

* * * * *

UNITED STATES PATENT AND TRADEMARK OFFICE
CERTIFICATE OF CORRECTION

PATENT NO. : 6,929,977 B2
DATED : August 16, 2005
INVENTOR(S) : Takase et al.

It is certified that error appears in the above-identified patent and that said Letters Patent is hereby corrected as shown below:

Column 8,
Line 1, after "semiconductor" replace "chip." by -- chips --.
Line 36, before "defined" replace "plan" by -- plane --.

Signed and Sealed this

Twenty-seventh Day of December, 2005

JON W. DUDAS
*Director of the United States Patent and Trademark Office*